United States Patent
Lee

(10) Patent No.: US 6,207,521 B1
(45) Date of Patent: Mar. 27, 2001

(54) THIN-FILM RESISTOR EMPLOYED IN A SEMICONDUCTOR WAFER AND ITS METHOD FORMATION

(75) Inventor: Jia-Sheng Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/330,041

(22) Filed: Jun. 11, 1999

(51) Int. Cl.[7] .................................................. H01L 21/20
(52) U.S. Cl. ........................ 438/384; 438/238; 438/329; 438/330; 438/381; 438/382
(58) Field of Search .................................. 438/238, 329, 438/330, 381, 382, 384; 338/173, 195, 254, 257, 307

(56) References Cited

U.S. PATENT DOCUMENTS 4,782,030 * 11/1988 Katsumata et al. ..................... 437/33
6,117,713 * 9/2000 Hoshino et al. ...................... 438/172
6,130,137 * 10/2000 Prall et al. ............................ 438/384

* cited by examiner

Primary Examiner—Matthew Smith
Assistant Examiner—Chuong A Luu
(74) Attorney, Agent, or Firm—Winston Hsu

(57) ABSTRACT

The present invention provides a thin-film resistor positioned on a semiconductor wafer and its method of formation. The thin-film resistor comprises a dielectric layer, a resistance layer, a protective layer, an insulating layer and two conductive layers. The dielectric layer is positioned on the semiconductor wafer. The resistance layer is positioned in a predetermined area of the dielectric layer. The protective layer positioned on the resistance layer comprises two openings formed above two ends of the resistance layer by using the wet-etching process. The insulating layer positioned on the protective layer comprises two openings on the two openings of the protective layer by using the dry-etching process. The two conductive layers are separately positioned in the two openings of the protective layer and the insulating layer to connect two ends of the resistance layer and function as two electrical terminals. The protective layer is used to prevent plasma damage to the resistance layer from the dry-etching process.

5 Claims, 3 Drawing Sheets

THIN-FILM RESISTOR EMPLOYED IN A SEMICONDUCTOR WAFER AND ITS METHOD FORMATION

BACKGROUND OF THE INVENTION

1. Field of the Invention

The present invention relates to a thin-film resistor, and more particularly to a thin-film resistor employed in a semiconductor wafer and its method of formation.

2. Description of the Prior Art

A thin-film resistor is not affected by temperature fluctuations and has low conductivity and stable resistance. Therefore, it is often used in the semiconductor circuit design. However, if the resistance layer of the thin-film resistor is uneven, the resistance will become unstable.

Please refer to FIG. 1. FIG. 1 is a sectional schematic diagram of the thin-film resistor 20 employed in the semiconductor wafer 10 according to the prior art. A thin-film resistor 20 is positioned on a semiconductor wafer 10 and comprises a first dielectric layer 12, two conductive layers 14, a second dielectric layer 16, and a resistance layer 18. The first dielectric layer 12 is positioned on the surface of the semiconductor wafer 10. The two conductive layers 14 are positioned in a predetermined area of the first dielectric layer 12. The second dielectric layer 16 positioned on the two conductive layers 14. There are two separate openings in the second dielectric layer 16 above the two conductive layers 14. The resistance layer 18 is positioned in a predetermined area of the second dielectric layer 16 and fills the two openings above the two conductive layers 14. Two ends of the two conductive layers 14 are in separate contact with the resistance layer 18, so the two conductive layers 14 are used as two electrical terminals of the resistance layer 18 when the semiconductor wafer 10 is electrically connected to external components.

The two conductive layers 14 are positioned in the predetermined area of the first dielectric layer 12 as the first step in the formation of the thin-film resistor 20. In the process, the surface of the semiconductor wafer 10 becomes uneven. The second dielectric layer 16 and the resistance layer 18 then sequentially deposited on the semiconductor wafer 10, but a step coverage problem occurs. The thickness of the deposited resistance layer 18 is uneven so as to cause adverse effects. The two conductive layers 14 are electrically linked with the resistance layer 18 such that greater resistance is generated in the thinner region of the resistance layer 18 and smaller resistance is generated in the thicker region of the resistance layer 18. Thus, the resistance generated from the thin-film resistor 20 varies based on the thickness of the resistance layer 18.

SUMMARY OF THE INVENTION

It is therefore a primary objective of the present invention to provide a thin-film resistor employed in a semiconductor wafer and its method of formation for preventing the resistance generated from the thin-film resistor from becoming unstable due to uneven thickness of the resistance layer.

In a preferred embodiment, the present invention provides a method for forming a thin-film resistor on a dielectric layer of a semiconductor wafer comprising:

forming a resistance layer, a protective layer and an insulating layer in a predetermined area of the dielectric layer wherein the protective layer is positioned on the resistance layer and the insulating layer is positioned on the protective layer;

performing a dry-etching process on the insulating layer in the predetermined area to form two openings extending down to the protective layer, the protective layer being used to prevent plasma damage to the resistance layer from the dry-etching process;

performing a wet-etching process on the protective layer through the two openings of the insulating layer to form two openings extending down to the resistance layer; and forming two separate conductive layers in the two openings of the insulating layer and the protective layer, the two conductive layers being used as two electrical terminals for connecting the two ends of resistance layer.

It is an advantage of the present invention that the thin-film resistor 40 comprises an even resistance layer 34 for preventing instability of resistance.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
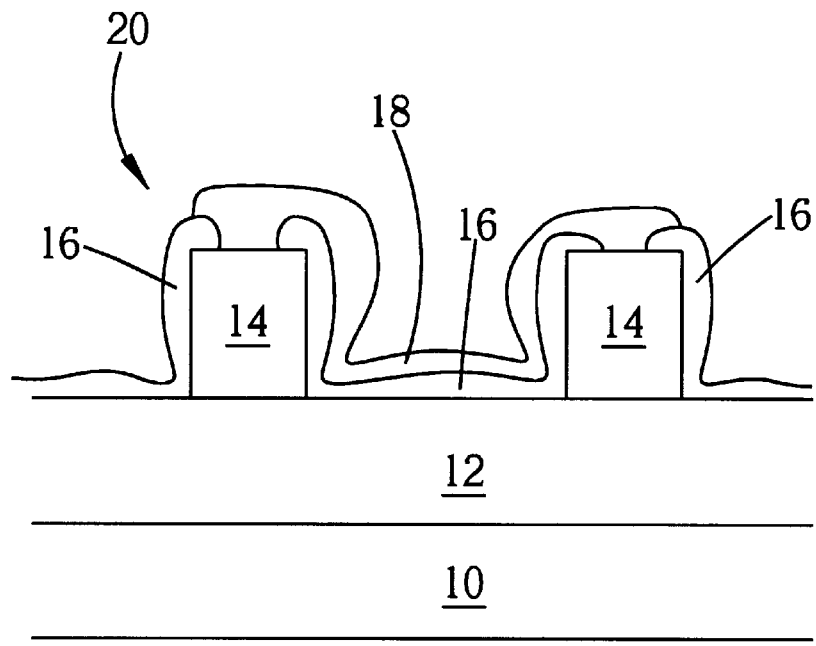
FIG. 1 is a sectional schematic diagram of the thin-film resistor employed in the semiconductor wafer according to the prior art.
Figure 2:
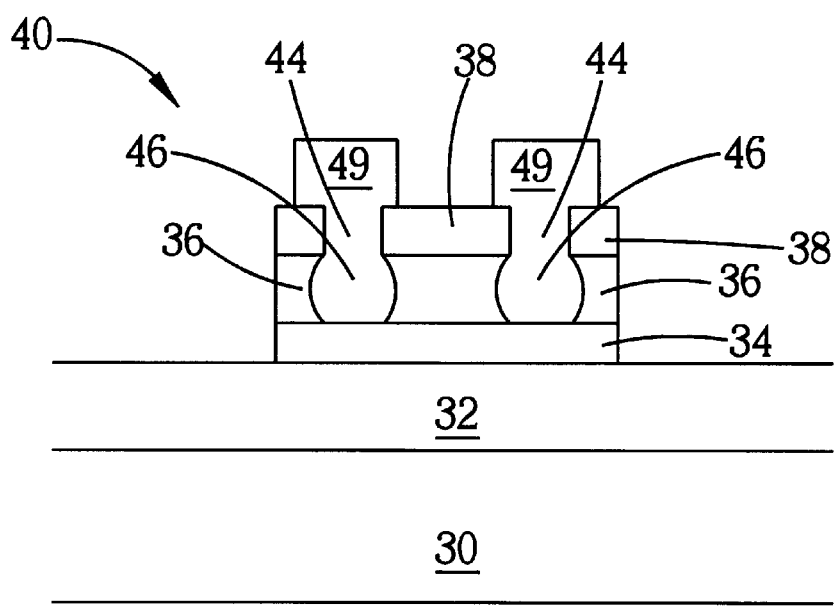
FIG. 2 is sectional schematic diagram of the thin-film resistor employed in the semiconductor wafer according to the present invention.

Please refer to FIG. 2. FIG.2 is sectional schematic diagram of the thin-film resistor 40 employed in the semiconductor wafer 30 according to the present invention. A thin-film resistor 40 positioned on a semiconductor wafer 30 comprises a dielectric layer 32, a resistance layer 34, a protective layer 36, and an insulating layer 38. The dielectric layer 32 is positioned on the surface of the semiconductor wafer 30. The resistance layer 34 is positioned in a predetermined area of the dielectric layer 32. The protective layer 36 positioned in the predetermined area above the resistance layer 34 comprises two openings 46 above two opposite ends of the resistance layer 34. The insulating layer 38 positioned in the predetermined area above the protective layer 36 comprises two openings 44 above the two openings 46 of the protective layer 36. The two openings 44 go through the two openings 46 and extend down to the two opposite ends of the resistance layer 34. The thin-film resistor 40 further comprises two conductivity layers 49 separately positioned in the two openings 44 and 46. The top ends of the two conductive layers 49 protrude from the upper surface of the insulating layer 38, and the bottom ends of the two conductive layers 49 separately connect the two ends of the resistance layer 34. The two conductive layers function as two electrical terminals of the two ends of the resistance layer 34. The protective layer 36 is used to prevent plasma damage to the resistance layer 34.

Figure 3:
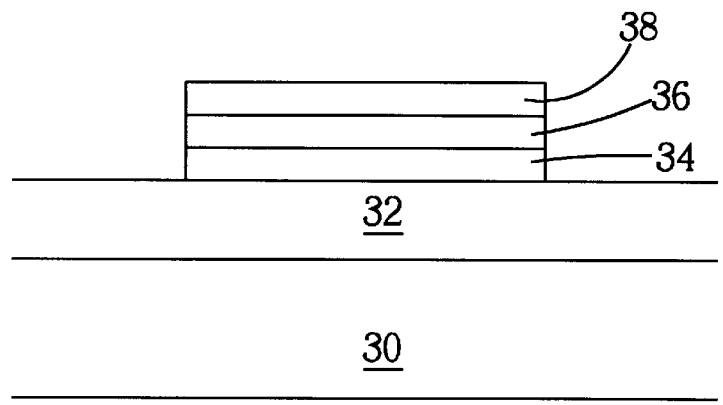
FIG. 3 to FIG. 5 are schematic diagrams of the method for forming the thin-film resistor shown in FIG. 2.
Figure 4:
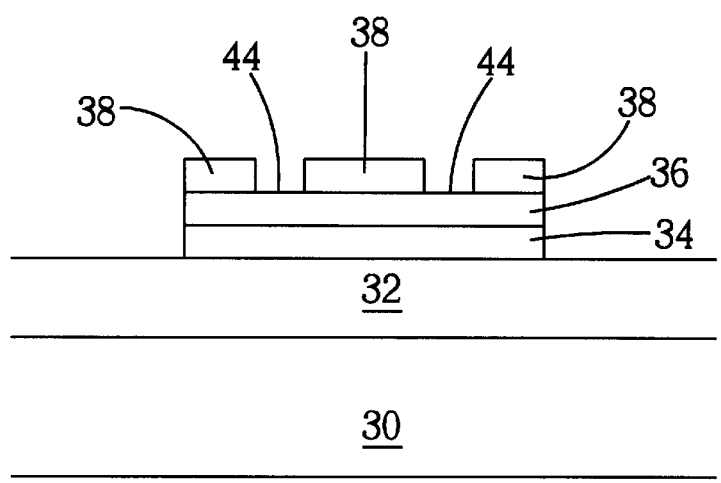
Figure 5:
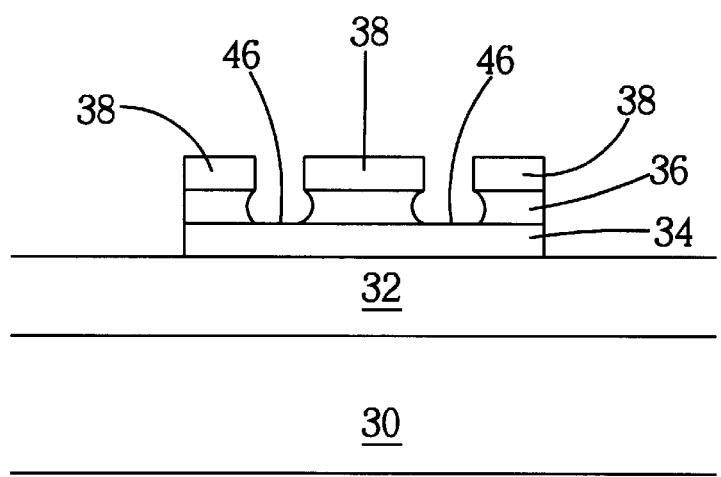

Please refer to FIG. 3 to FIG. 5. FIG. 3 to FIG. 5 are schematic diagrams of the method for forming the thin-film resistor 40 shown in FIG. 2. The thin-film resistor 40 is formed on the dielectric layer 32 positioned on the semiconductor wafer 30. The dielectric layer is made of borophosphosilicate glass (BPSG). As a first step in the formation of the thin-film resistor 40, the resistance layer 34 is formed in the predetermined area of the dielectric layer 32. This layer is made of SiCr (chromium silicon). The protective layer 36 is formed on the resistance layer 34 and the insulating layer 38 is formed on the protective layer 36 by chemical vapor deposition (CVD). The protective layer 36 is made of silicon nitride (SiN) and the insulation layer 38 is made of silicon oxide. The protective layer 36 protects the resistance layer 34 from dry-etching-induced plasma damage to the resistance. Next, anisotropic dry-etching is performed to remove the resistance layer 34, the protective layer 36 and the insulating layer 38 in areas outside of the predetermined area as shown in FIG. 3.

Two openings 44 are then formed in the insulating layer 38 through dry-etching. These openings extend down to the resistance layer 34 as shown in FIG. 4. Next, the protective layer 36 is subjected to wet-etching with $H_3PO_4$ (phosphoric acid). The $H_3PO_4$ is introduced through the two openings 44 to form the two openings 46. Openings 46 extend down to the resistance layer 34. The two openings 44 of the insulating layer 38 go through the two openings 46 of the protective layer 36 and extend down to the two opposite ends of the resistance layer 34 as shown in FIG. 5. Finally, two separate conductive layers 49 are formed in the two openings 44 and 46. The conductive layers 49 are made of an aluminum alloy. The two conductive layers 49 connect the two ends of the resistance layer 34. The top ends of the two conductive layers 49 protrude from the upper surface of the insulating layer 38. Therefore, the two conductive layers function as two electrical terminals of the two ends of the resistance layer 34.

The dielectric layer 32 is level so positioning the resistance layer 34 of the thin-film resistor 40 on top will not lead to instability of its resistance when it is electrically connected. Also, during formation of the two openings 44 and 46 down to the resistance layer 34, dry-etching is first performed on the insulating layer 38 then wet-etching is applied to the protective layer 36. Therefore, the required surface area for the thin-film resistor 40 is reduced and can be utilized in producing a smaller gate width. Furthermore, formation of the two openings 44 down to the protective layer prevents plasma damage to the resistance layer and preserves the stability of the resistance generated from the thin-film resistor 40.

Figure 6:
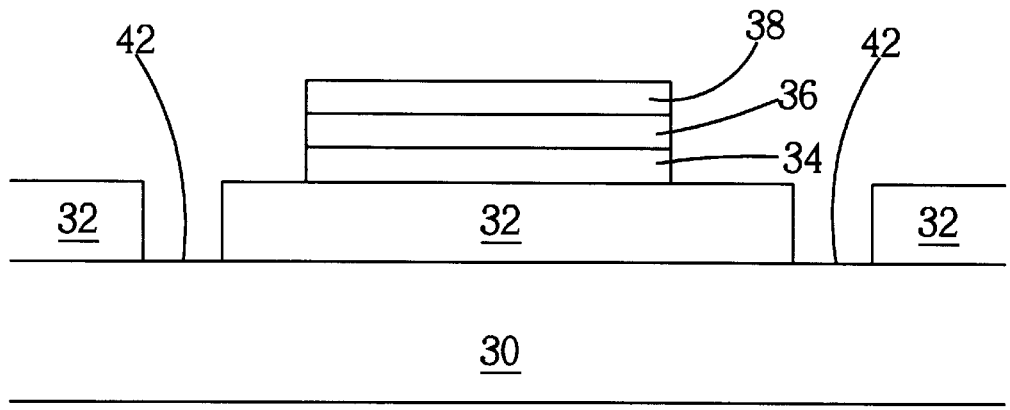
FIG. 6 to FIG. 8 are schematic diagrams of an alternative embodiment according to the present invention.
Figure 7:
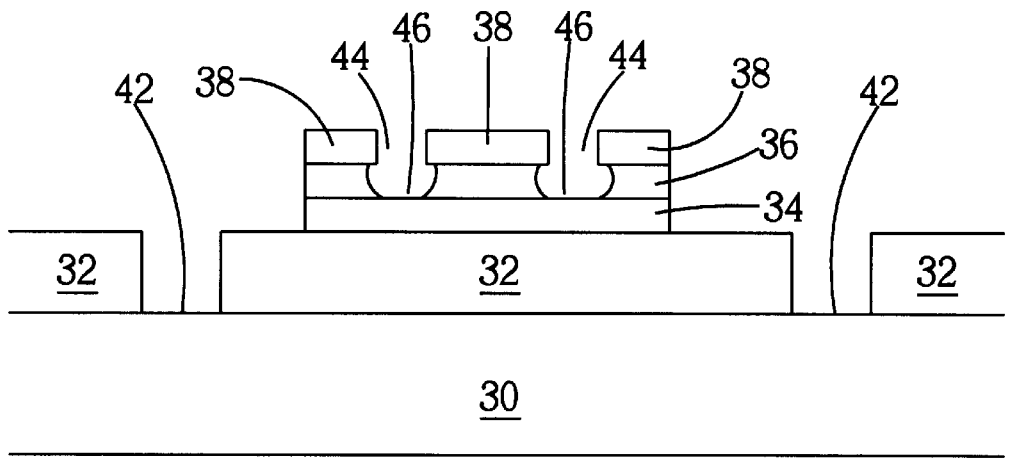
Figure 8:
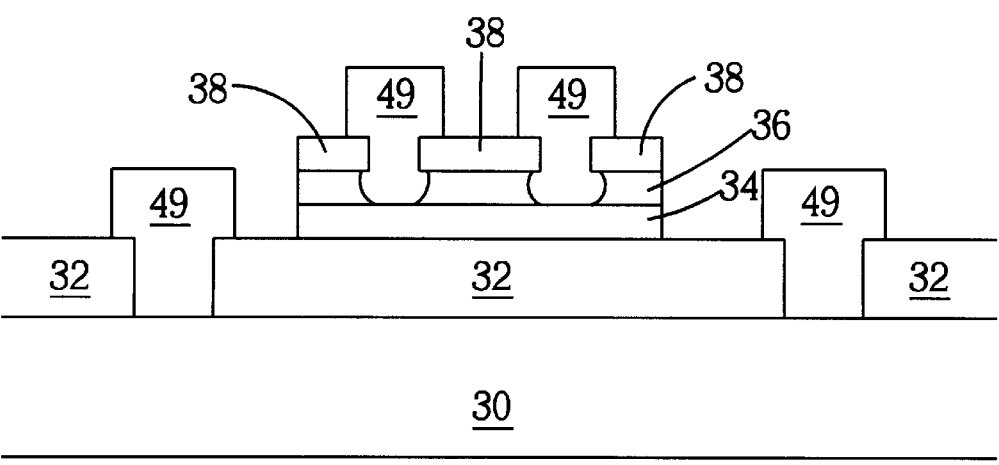

Please refer to FIG. 6 to FIG. 8. FIG. 6 to FIG. 8 are schematic diagrams of an alternative embodiment according to the present invention. When the resistance layer 34, the protective layer 36 and the insulating layer 38 have been formed in the predetermined area of the dielectric layer 32 according to the method of the present invention, dry-etching may be repeated in areas outside the predetermined area of the dielectric layer 32 to form two contact holes 42 as shown in FIG. 6. The two contact holes 42 are employed as two channels of electrical connection between the devices of the semiconductor wafer 30. Then, dry-etching and wet-etching are performed according to the aforementioned method to form the two openings 44 and 46 down to the resistance layer 34 as shown in FIG. 7. Finally, two separate conductive layers 49 are formed in the two contact holes 42 at the same time they are formed in the two openings 44 and 46 as shown in FIG. 8. Each conductive layer 49 is able to electrically connect to the device of the semiconductor wafer 30 through each contact hole Compared to the thin-film resistor 20 of the prior art, the dielectric layer 32 of the present invention has a level surface thus enabling the thickness of the resistance layer 34 formed on the dielectric layer 32 to be uniform. The two conductive layers 49 positioned in the two openings 44 and 46 extend down to the resistance layer 34 and connect the two ends of the resistance layer 34. Therefore, the resistance of the thin-film resistor 40 will not become unstable.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for forming a thin-film resistor on a dielectric layer of a semiconductor wafer comprising:

forming a resistance layer, a protective layer and an insulating layer in a predetermined area of the dielectric layer wherein the protective layer is positioned on the resistance layer and the insulating layer is positioned on the protective layer;

performing a dry-etching process on the insulating layer in the predetermined area to form two openings extending down to the protective layer, the protective layer being used to prevent plasma damage to the resistance layer from the dry-etching process;

performing a wet-etching process on the protective layer through the two openings of the insulating layer to form two openings extending down to the resistance layer; and forming two separate conductive layers in the two openings of the insulating layer and the protective layer, the two conductive layers being used as two electrical terminals for connecting the two ends of resistance layer.

2. The method of claim 1 wherein the resistance layer, the protective layer and the insulating layer are formed in the predetermined area by performing the following steps:

forming the resistance layer on the dielectric layer;

forming the protective layer on the resistance layer;

forming the insulating layer on the protective layer; and performing an anisotropic dry-etching process to remove the resistance layer, protective layer and insulating layer outside the predetermined area.

3. The method of claim 1 wherein the dielectric layer is formed of borophosphosilicate glass (BPSG), the resistance layer is formed of SiCr (chromium silicon), the protective layer is formed of silicon nitride by using a chemical vapor deposition (CVD) process, and the insulating layer is formed of silicon oxide by using a CVD process.

4. The method of claim 1 wherein the wet-etching process employs $H_3PO_4$ (phosphoric acid) as the etching solution.

5. The method of claim wherein both the two conductive layers are formed of an aluminum-based alloy.

* * * * *